US008694474B2

(12) United States Patent
Wu

(10) Patent No.: US 8,694,474 B2
(45) Date of Patent: Apr. 8, 2014

(54) BLOCK ENTROPY ENCODING FOR WORD COMPRESSION

(75) Inventor: Zhao Wu, Beijing (CN)

(73) Assignee: Microsoft Corporation, Redmond, WA (US)

(*) Notice: Subject to any disclaimer, the term of this patent is extended or adjusted under 35 U.S.C. 154(b) by 47 days.

(21) Appl. No.: 13/177,044

(22) Filed: Jul. 6, 2011

(65) Prior Publication Data
US 2013/0013574 A1 Jan. 10, 2013

(51) Int. Cl.
*G06F 7/00* (2006.01)
*G06F 17/30* (2006.01)

(52) U.S. Cl.
USPC .......................................... 707/693; 707/796

(58) Field of Classification Search
USPC ......................... 707/693, 715, 796
See application file for complete search history.

(56) References Cited

U.S. PATENT DOCUMENTS

| 5,706,365 | A * | 1/1998 | Rangarajan et al. | 707/728 |
|---|---|---|---|---|
| 6,721,753 | B1 * | 4/2004 | Tsubokura et al. | 1/1 |
| 7,296,030 | B2 * | 11/2007 | Vo et al. | 707/693 |
| 8,078,617 | B1 * | 12/2011 | Neveitt et al. | 707/732 |
| 2002/0152219 | A1 * | 10/2002 | Singh | 707/101 |
| 2003/0212695 | A1 * | 11/2003 | Rissanen | 707/101 |
| 2006/0123035 | A1 * | 6/2006 | Ivie | 707/101 |
| 2010/0223237 | A1 | 9/2010 | Mishra | |
| 2011/0016136 | A1 * | 1/2011 | Isaacson et al. | 707/756 |

OTHER PUBLICATIONS

Manber. A Text Compression Scheme that Allows Fast searching Directly in the Compressed File. Apr. 1997. ACM Transactions on Information Systems, vol. 15, No. 2, pp. 124-136.*
Nakamura et al. Data compression by concatenations of symbol pairs. 1996. In Proceedings of the IEEE International Symposium on Information Theory and Its Applications (Victoria, BC), pp. 496-499.*
Larsson et al. Offline Dictionary-Based Compression. Nov. 2000. Proceedings of the IEEE, vol. 88, No. 11. pp. 1722-1732.*
"How to use the grep command, by the Linux Information Project (LINFO)". The Linux Information Project [online], 2006 [retrieved on Oct. 21, 2012][archived at archive.org on Jul. 20, 2007]. Retrieved from the Internet <URL: http://web.archive.org/web/20070720193904/http://www.linfo.org/grep.html>.*
Weiling Chang, Binxing Fang, Xiaochun Yun, Shupeng Wang, "The Blck Lossless Data Compression Algorithm", IJCSNS International Journal of Computer Science and Network Security, vol. 9 No. 10 (Oct. 2009).
Jurgen Abel, William Teahan, "Universal Text Preprocessing for Data Compression", IEEE (Jan. 2005).
Prateek Rungta, "Domain Based Lossless Text Compression—Report", FIT 2044 Seacond Year Advanced Project (Sep. 2007).
Daniel A. Nagy, "Lossless Compression and Alphabet Size", Queen's University, Kingston, Ontario, Canada (Jan. 2006).

(Continued)

*Primary Examiner* — James E Richardson
(74) *Attorney, Agent, or Firm* — Dave Ream; Doug Barker; Micky Minhas

(57) ABSTRACT

A computer-implemented method, computer-readable media, and a computerized system to compress words are provided. The computerized system includes a compression engine that compresses a list of words. The compression engine generates a symbol list from the list of words, decomposes the words using the symbol list and a cost function, and encodes the decomposed words. The words may be from a search index. The compression engine may be utilized to reduce the size of the search index and improve efficiency.

12 Claims, 6 Drawing Sheets

(56) References Cited

OTHER PUBLICATIONS

Nan Zhang, "Transform Based and Search Aware Text Compression Schemes and Compressed Domain Text Retrieval", College of Engineering and Computer Science at the University of Central Florida, Orlando, Florida (Spring 2005).

Tim Bell, Matt Powell, Amar Mukherjee, Don Adjeroh, "Searching BWT compressed text with the Boyer-Moore algorithm and binary search" (Nov. 2001).

TwVX Tthm, Tmbg Txfk and Tthh usn trryv Aluuaj, Txfk-aat-Ttug, "Huffmenglish: A Proposal for Lossless Entropy-Encoded Spelling Reform", SpecGram vol. CLXl, No. 2. (Published Mar. 2011). Available at: http://specgram.com/CLXI.2/11.tthm.huffmenglish.html.

Fauzia S. Awan, Amar Mukherjee, "LIPT: A Lossess Text Transform of Improve Compression", University of Central Florida School of Electrical Engineering and Computer Science, Orlando, Florida (Published 2001).

Fauzia S. Awan: Nan Zhang, Nitin Motgi, Raja T. Iqbal, Amar Mokheriee, "LIPT: A Reversible Lossless Text Transform to Improve Compression Performance", University of Central Florida School of Electricai Engineering and Computer Science, Orlando, Florida (Published 2001).

\* cited by examiner

| 210 WEIGHTS (W) | 220 PROGRESS | 230 COST FUNCTION |
|---|---|---|
| 100-0 | 0-10 | |
| 90-10 | 10-20 | (W)N-GRAM STAT |
| 80-20 | 20-30 | + |
| 70-30 | 30-40 | (W)POST |
| 60-40 | 40-50 | DECOMPOSITION |
| 50-50 | 50-60 | STAT |
| 40-60 | 60-70 | |
| 30-70 | 70-80 | |
| 20-80 | 80-90 | |
| 10-90 | 90-100 | |
| 0-100 | Finished | |

BLOCK ENTROPY ENCODING FOR WORD COMPRESSION

BACKGROUND

Conventionally, a search engine utilizes indices to locate results that match a search term received by the search engine. The search indices are specialized databases that store, among other things, words included in a corpus of documents and location information associated with the documents. As new words are introduced to express thoughts and ideas, the search indices continue to expand. For instance, some search indices store millions of words. Thus, conventional search indices are very large databases.

To reduce the size of the search indices, compression algorithms are used to efficiently store the data in the search indices. A compressed index is able to store more words, which may potentially improve the results located by the search engine. Conventional compression algorithms for search indices have focused on reducing the storage space required for the location information, i.e., positions of the words in the documents, document identifiers, or both. The location information is sometimes referred to as a posting list. The posting lists typically require a large part of the available storage space in search indices. Accordingly, these conventional compression techniques compress the posting lists to increase the available space for additional words and posting lists.

Although compressed posting lists do offer significant savings in storage space, additional storage space may be saved if the words in the indices are also compressed.

SUMMARY

Embodiments of the invention relate in one regard to a search system, computer-readable media, and computer-implemented methods that decompose words in search indices, compress the words in the search indices, and search for the compressed words in the search indices. The search system includes a search engine and a compression engine that decomposes the words and compresses the search indices.

The compression engine may be invoked in at least two scenarios: index generation and search result retrieval. During index generation, the compression engine scans a generated index, parses all index words, and encodes the words to compress the index. The compression engine produces a symbol list from the parsed index words. The symbol list allows the compression engine to translate common substrings found in the index to compact binary encoding. During search result retrieval, the search engine receives a search request from a user and transmits it to the compression engine. The compression engine receives the search request, decomposes the search terms based on the symbol list associated with the search index. In turn, the compression engine encodes the search request in accordance with the symbol list. The encoded search request is transmitted to the search engine, which may utilize the encoded search request to traverse the compressed search index and to determine whether one or more words in the search index match the encoded search request.

The compressed search indices include index words and posting lists. In one embodiment, the posting list includes positions of each word in all indexed documents. In another embodiment, for each index word, the compressed search indices may store a reference to a posting list. The search engine utilizes the posting list corresponding to the compressed index words that match the encoded search request. The search engine receives the posting list from the compression index and generates a search result page based on the posting lists. Finally, the search engine may transmit the search results to a user that generated the search request.

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

BRIEF DESCRIPTION OF THE DRAWINGS

Illustrative embodiments of the invention are described in detail below with reference to the attached figures, which are incorporated by reference herein and wherein:

FIG. 2 is a table that illustrates an exemplary cost function utilized to identify appropriate substrings for the words stored in the indices in accordance with embodiments of the invention;

DETAILED DESCRIPTION

Figure 1:
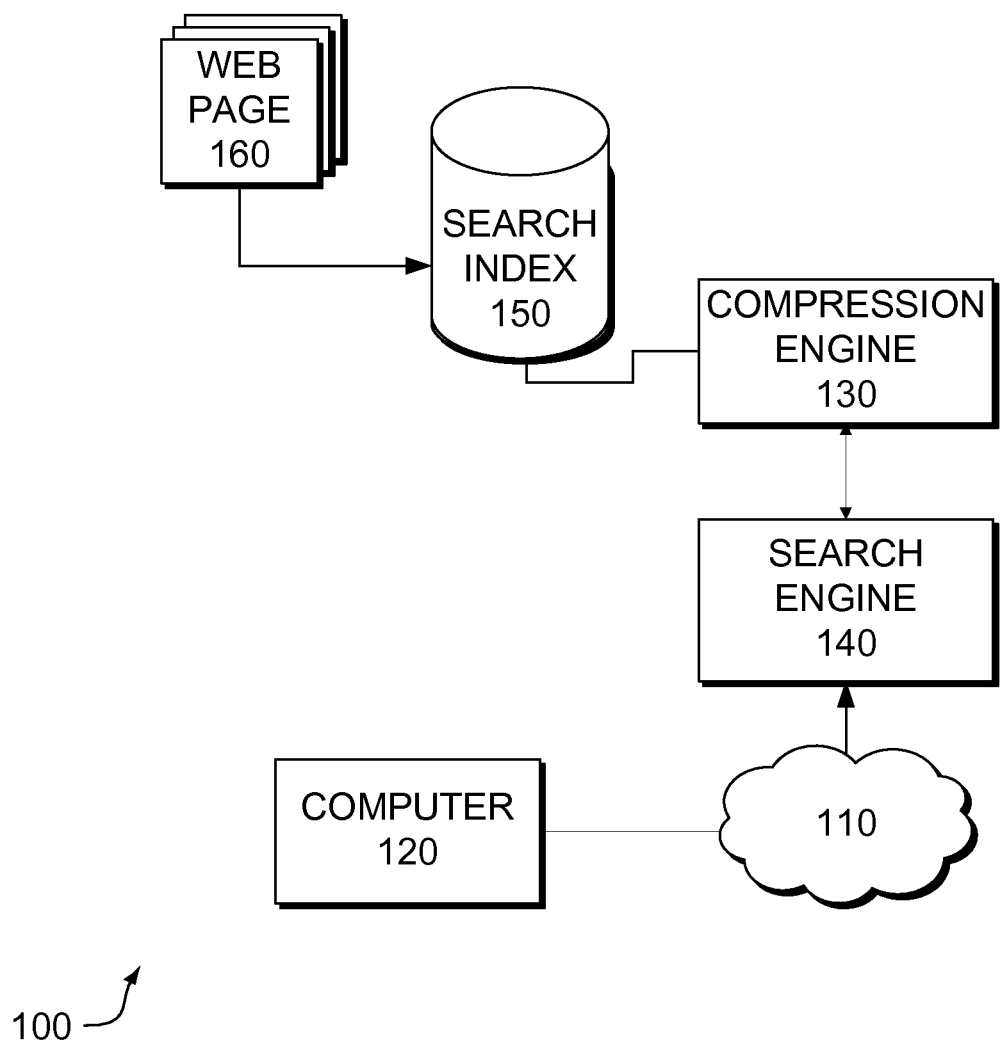
FIG. 1 is a network diagram that illustrates an exemplary search system in accordance with embodiments of the invention.

This patent describes the subject matter for patenting with specificity to meet statutory requirements. However, the description itself is not intended to limit the scope of this patent. Rather, the inventors have contemplated that the claimed subject matter might also be embodied in other ways, to include different steps or combinations of steps similar to the ones described in this patent, in conjunction with other present or future technologies. Moreover, although the terms "step" and "block" may be used herein to connote different elements of methods employed, the terms should not be interpreted as implying any particular order among or between various steps herein disclosed unless and except when the order of individual steps is explicitly described. Further, embodiments are described in detail below with reference to the attached drawing figures, which are incorporated in their entirety by reference herein.

Embodiments of the invention provide a searchable compressed index. In one embodiment, the lossless compression algorithm is employed to reduce the storage space required to store index words. The lossless compression algorithm is applied to decomposed index words. Instead of treating each letter as a symbol, the compression engine utilizes the lossless compression algorithm to discover commonly used substrings in the index words. The compression engine decomposes the index words into these substrings while trying to minimize a storage cost. In some embodiments, the cost is measured as function of sub-string length.

In some embodiments, the compression engine is configured to implement any one of the following compression algorithms on the decomposed index words: (a) entropy encoding, e.g., Huffman, arithmetic, etc.; (b) dictionary encoding, e.g., LZ77, LZ78, etc.; (c) Burrows-Wheeler Transformation, e.g., bzip, etc.; and (d) statistical model, e.g., LZPM, etc. One or more of these algorithms may utilize a symbol list that stores the substrings identified by the compression engine. The compression engine may identify the symbol list via one or more decompression algorithms. In one embodiment, the symbol list is generated using common bi-gram substrings identified in the index. In an alternate embodiment, the symbol list is generated using common n-gram substrings—identified in the index—that minimize a specified cost function.

As one skilled in the art will appreciate, the search system may include hardware, software, or a combination of hardware and software. The hardware includes processors and memories configured to execute instructions stored in the memories. In one embodiment, the memories include computer-readable media that store a computer-program product having computer-useable instructions for a computer-implemented method. Computer-readable media include both volatile and nonvolatile media, removable and nonremovable media, and media readable by a database, a switch, and various other network devices. Network switches, routers, and related components are conventional in nature, as are means of communicating with the same. By way of example, and not limitation, computer-readable media comprise computer-storage media and communications media. Computer-storage media, or machine-readable media, include media implemented in any method or technology for storing information. Examples of stored information include computer-useable instructions, data structures, program modules, and other data representations. Computer-storage media include, but are not limited to, random access memory (RAM), read only memory (ROM), electrically erasable programmable read only memory (EEPROM), flash memory or other memory technology, compact-disc read only memory (CD-ROM), digital versatile discs (DVD), holographic media or other optical disc storage, magnetic cassettes, magnetic tape, magnetic disk storage, redundant arrays of inexpensive disks (RAID), and other magnetic storage devices. These memory technologies can store data momentarily, temporarily, or permanently.

In yet another embodiment, the search system includes a compression engine, search engine, search index, computer, and document corpuses. The search index is configured to store references to the documents and words contained in the documents. A user may generate a query at a computer, which is communicatively connected to the search engine. In turn, the computer may transmit the search request to the search engine. The search engine may forward the search request to the compression engine. And the compression engine encodes the search request and returns the encoded search request to the search engine. The search engine utilizes the encoded search request to locate search results in the compressed search index. The search engine may communicate the search results to the user.

FIG. 1 is a network diagram that illustrates an exemplary search system 100 in accordance with embodiments of the invention. The search system 100 comprises network 110, computer 120, compression engine 130, search engine 140, search index 150, and web pages 160.

The network 110 connects computer 120 and search engine 140. The network 110 is configured to facilitate communication between the computer 120 and the search engine 140. The network 110 may be a communication network, such as a wireless network, local area network, wired network, or the Internet. In an embodiment, the computer 120 interacts with the search engine 140 utilizing the network 110. In response, the search engine 140 provides web pages 160, images, videos, or other electronic documents that contain words provided or selected by the user.

The computer is connected to the search engine 140 via network 110. The computer 120 is utilized by a user to generate search words, to hover over objects, or to select links or objects, and to receive results or web pages 160 that are relevant to the search terms, the selected links, or the selected objects. The computer 120 includes, without limitation, personal digital assistants, smart phones, laptops, personal computers, gaming systems, set-top boxes, or any other suitable client computing device. The computer 120 includes user and system information storage to store user and system information on the computer 120. The user information may include search histories, cookies, and passwords. The system information may include Internet Protocol addresses, cached web pages 160, and system utilization. The computer 120 communicates with the search engine 140 to receive the results or web pages 160 that are relevant to the search terms, the selected links, or the selected objects.

The compression engine 130 is connected to the search index 150 and search engine 140. The compression engine 130 is a computing device configured to compress the search index 150 and to encode search requests received from the search engine 140. Moreover, the compression engine 130 may encode search requests received from the search engine 140.

In one embodiment, the compression engine 130 compresses the search index via one of two compression algorithms, or via a both algorithms. In both compression algorithms, the compression engine 130 executes logic for a decomposition phase and an encoding phase. In the decomposition phase, a symbol list is created by the compression engine. In turn, the compression index encodes the index based on the symbol list. In the first algorithm, executed by the compression engine 130, index words are parsed into n-grams. An n-gram is a sub-string with n characters, where n is whole number. In the second algorithm, executed by the compression engine 130, index words are parsed into bi-grams. A bi-gram is substring whose length is 2. In both algorithms, the goal is to locate the best substrings to include in symbol list that will be utilized by the encoding phase of the two compression algorithms.

In the first algorithm, during the decomposition phase, each word in the index is parsed into n-grams. For instance, the word "microsoft" may be parsed into the eight 2-grams, seven 3-grams, etc. The compression engine 130 determines the occurrence for each identified n-gram. In one embodiment, the occurrence is a count that reflects the frequency with which the n-gram appears in the index. In turn, the compression engine 130 calculates a cost function to aid in selection of substrings that should be included in the symbol list. The compression engine may include a local storage that temporally stores the n-grams and corresponding occurrences.

The cost function may be based on the occurrences calculated for the n-grams. In some embodiments, the cost function may be the sum of the static occurrence statistics and post-decomposition occurrence statistics. The static occurrence statistics may include the count associated with each n-gram. For instance, when the index words include "microsoft";

"microscope"; and "micro economy"; the occurrence count for the 5-gram "micro" is three and the occurrence count for the 6-gram "micros" is two.

On the other hand, the post-decomposition occurrence statistics may include updated counts that reflect selection of several n-grams as common substrings for inclusion in the symbol list. For instance, if the compression engine 130 selects "micro" as a common substring but does no select "micros"; the post-decomposition statistics for the index words "microsoft"; "microscope"; and "micro economy" may be updated as follows. The compression engine 130 may count three, for the occurrence count for the 5-gram "micro" but zero as the occurrence count for the 6-gram "micros"; because this is not a selected substring. However, if the compression engine 130 selects "micros" as a common substring but does not select "micro"; the post-decomposition statistics for the index words "microsoft"; "microscope"; and "micro economy" may be updated as follows. The compression engine 130 may count zero as the occurrence count for the 5-gram "micro" but two as the occurrence count for the 6-gram "micros" because this is a selected substring but "micro" is not. Thus, the compression engine 130 calculates the cost and attempts to either minimize the cost function or maximize the cost function. In some embodiments, the cost function is minimized.

In one embodiment, both the static occurrence statistics and the post-decomposition statistics are assigned weights by the compression engine 130. The weights are utilized to vary the influence a specific occurrence statistic has. The weights may change as a function of the decomposition progress achieved by the compression engine 130. In certain embodiments, the cost function may be calculated via dynamic programming by the compression engine 130. In another embodiment, an alternate cost function may be created to minimize the length of n-grams included in the symbol list.

The occurrence information for the sub-string may be utilized during several iterations by the compression engine 130. The post-decomposition occurrence statistics may be filtered by the compression engine 130 to remove substrings below a specified threshold before beginning another iteration. The threshold may be specified by index designers to tune the compression ratio. In one embodiment, the threshold may be an average for all the post-decomposition occurrence statistics generated by the compression engine 130. Alternatively, the compression engine 130 may utilize a histogram to identify 75% percent of the maximum post-decomposition occurrence statistics as the threshold.

In yet another embodiment, the static occurrence statistics may be updated with the post-decomposition statistics that are generated by the compression engine 130 based on the selected common substrings. In other words, the post-decomposition statistics identified during the previous iteration are utilized as static decomposition statistics in the subsequent iteration to find new post-decomposition statistics. The decomposition phase of the first algorithm is complete when the compression engine meets the stopping criteria. For instance, the stopping criteria may be minimizing the cost function.

In the second algorithm, executed by the compression engine 130, index words are parsed into bi-grams. Here, the compression engine 130, during the decomposition phase, parses each word in the index into bi-grams. For instance, the word "microsoft" may be parsed into eight bi-grams. The compression engine 130 determines the occurrence for each identified bi-gram. If the occurrence of the bi-gram is above a specified threshold, the bi-gram is replaced with a super-gram. The specified threshold may be set by the index designer and may represent an average frequency associated with previously compressed search indices.

In one embodiment, the super-gram is a new symbol that is introduced to replace the bi-gram. The new symbol is treated as a single character by the compression engine 130. Thus, the compression engine 130 updates the identified bi-grams with the new symbol. For instance, if the bi-gram "mi" was replaced by the compression engine 130 with super-gram β because it exceeded the threshold, the compression engine 130 may form new bi-grams, e.g., "βc" utilizing the super-gram. The bi-grams and super-grams are included in the symbol list by the compression engine 130. In some embodiments, the bi-grams may be filtered by the compression engine 130 based on occurrences to remove the bi-grams or super-grams that fall below a specified occurrence threshold.

Once the compression engine 130 generates the symbol list having the common substrings, the compression engine begins the encoding phase where the indices are encoded. In one embodiment, the compression engine is configured to implement Huffman encoding on the index words based on the symbol list. The compression engine 130 uses a variable length encoding of the words, where the least number of bits represents the most common substring with the largest occurrence in the search index to transform the search index to the compressed search index 150.

After encoding, the compressed search index 150 may have additional storage space for new words or phrases. In one embodiment, search engine 140 accesses the compressed search index 150, which may store more words than an uncompressed search index based on encoded search requests received from the compression engine 130. Thus, in the compressed search index 150, the search engine 140 is more likely to locate entries that precisely match the search request.

The search engine 140 is communicatively connected via network 110 to the computers 120. The search engine 140 is also connected to compression engine 130. In certain embodiments, the search engine 140 is a server device that generates visual representations for display on the computers 120. The search engine 140 receives, over network 110, selections of words or selections of links from computers 120 that provide interfaces that receive interactions from users.

In certain embodiments, the search engine 140 communicates with the compression engine to access the compressed search index 150. The search engine 140 provides the compression engine 130 with a search request. The search request may be encoded—based on the symbol list associated with the compressed search index 150—by the compression engine 130. In turn, the compression engine 130 transmits the encoded search request to the search engine 140. The search engine utilizes the encoded search request to identify results that match the search request. In turn, the search engine 140 examines the results and provides the computers 120 a set of uniform resource locators (URLs) that point to web pages, images, videos, or other electronic documents that satisfy the search request.

The compressed search index 150 stores, among other things, index words and posting lists for each document. The search engine 140 may request one or more records from compressed search index 150. In turn, the compressed search index 150 locates records that satisfy the request and transmits those records to the search engine 140.

The web page 160 provides details about items that interest the user. The web pages 160 are indexed by the compressed search index 150. Each web page 160 may include words or metadata. The words or metadata is used by the index servers to store the web page in an appropriate location in a posting list. Additionally, the web pages 160 are associated with URLs that may also be stored by the compressed search index 150.

Accordingly, the search system 100 is configured with a search engine 140 that provides results that include web pages 160 and objects to the computers 120. The compression engine 130 encodes a search request received from the search engine, which traverses the compressed search index 150 to obtain results that satisfy the encoded version of the search requests received from the users. The search engine transmits the results to the computers 120. In turn, the computers 120 render the results for the users.

As explained above, in certain embodiments, the compression engine may utilize weights to vary the influence a specific occurrence statistic has on the cost function. Thus, the compression engine 130 may assign different weights to the elements of the cost function.

FIG. 2 is a table 200 that illustrates an exemplary cost function utilized to identify appropriate substrings for the words stored in the indices in accordance with embodiments of the invention. The table 200 has three columns: weights 210, progress 220, and cost function 230. The table 200 may be utilized by the compression engine to assign weights to the static decomposition statistics and post-decomposition statistics.

In one embodiment, the weights 210 assigned to the cost function 230 change as the compression engine makes progress 220 decomposing the index words. For instance, the compression engine may assign a weight 210 of 100% to the static decomposition statistic and a weight 210 of 0% to the post-decomposition statistic when the compression engine has a progress 220 that is less than 10% of the index words. When the compression engine has a progress 220 between 10% and 20%, the compression engine may assign a weight of 90% to the static decomposition statistic and a weight of 10% to the post-decomposition statistic when the compression engine has progressed to more than 10% of the index words but less than 20%. Accordingly, the weights may be assigned in windows that vary at progress 220 increments. In some embodiments, the window and progress increments are 10. In alternate embodiments, the window and progress increments may be different.

The compression engine utilizes the cost function of the first algorithm to select substrings for the symbol list. In the second algorithm, a threshold may be utilized to select the bi-gram that should be included in the symbol list. When the bi-grams exceed a first occurrence threshold, a super-gram is created. In turn, if the bi-grams or super-grams fall below a second occurrence threshold, they may be dropped from the symbol list by the compression engine. The bi-grams and super-grams that are stored in the symbol list also include occurrence counts that may be utilized during the encoding phase.

Figure 3:
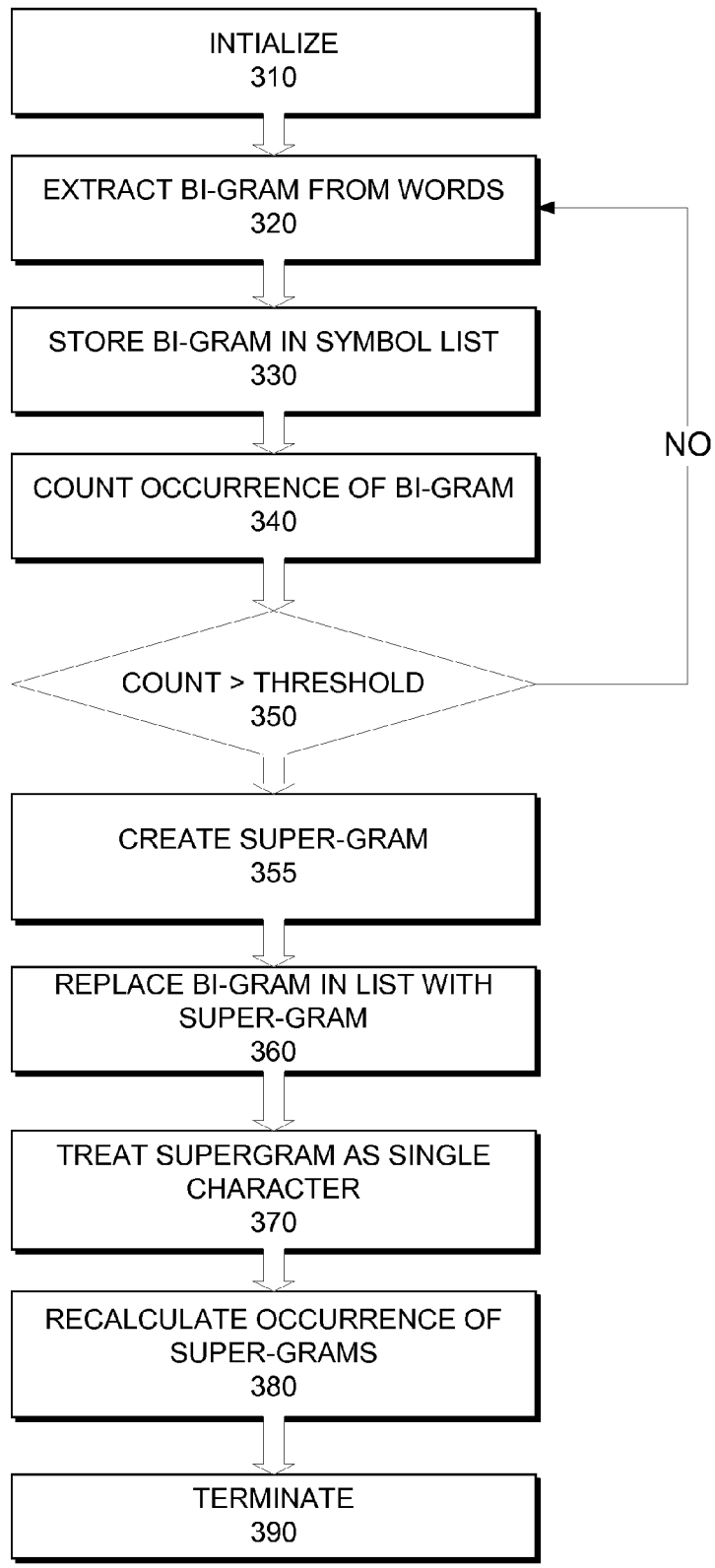
FIG. 3 is a logic diagram that illustrates a method to create a symbol list for the words stored in the indices in accordance with embodiments of the invention.

FIG. 3 is a logic diagram that illustrates a method to create a symbol list for the words stored in the indices in accordance with embodiments of the invention. The compression engine initializes the method in step 310. In step 320, the compression engine extracts bi-grams from the index words. The compression engine parses each word in an index to create a list of bi-grams. For instance, the compression engine reads a character from the current word and forms a bi-gram with the previous character. In step 330, the compression engine stores the bi-grams in a symbol list. In turn, the compression engine counts an occurrence of each bi-gram, in step 340. The occurrence counts are associated with the bi-grams in the list. The compression engine determines whether the occurrence count is above a specified threshold, in step 350.

In one embodiment, the compression engine does nothing if the occurrence count is below a first occurrence threshold. The compression engine continues generating bi-grams for the remaining index words. In some other embodiments, the compression engine may drop a bi-gram when the count is below an occurrence threshold. In step 355, the compression engine may create a super-gram that represents the bi-gram when the occurrence count is above a specified occurrence threshold. In step 360, the compression engine replaces the bi-gram with the super-gram in the symbol list. Also, the compression engine, in step 370, treats the super-gram as a single character. In turn, the compression engine locates new bi-grams using the super-gram. For instance, the compression engine reads a character from a current word and forms a new bi-gram with the super-gram. In one embodiment, the compression engine creates new bigrams for each word by combining a super-gram and the character or super-gram following it, or preceding it. In step 380, the compression engine calculates an occurrence count for the new bi-grams that are formed with the super-gram. In step 385, the compression engine determines whether all words in the index have been processed. If more words need processing, the compression engine returns to step 320. Otherwise, the compression engine, in step 390, may terminate after all words are processed.

The compression engine compresses the index using the symbol list and occurrence count. In one embodiment, the compression engine performs a Huffman encoding on the words in the index using the symbol list and occurrence count. In an alternate embodiment, the compression index performs an arithmetic encoding on the words in the index using the symbol list and occurrence count.

Accordingly, the compression engine generates a symbol list based on bi-grams. In one embodiment, as the compression engine reads each character, which can be a single byte, or multiple bytes as in UTF-8 or UTF-16, bi-grams are formed using the current character and the previous character. If the compression engine previously identified the bi-gram, an occurrence count associated with the bi-gram is incremented. Once the occurrence count goes beyond a certain threshold, the bi-gram is replaced by a "super-gram" symbol. The compression engine treats the super-gram as a 1-gram. In one embodiment, the compression engine may replace a super-gram in combination with a character, a new bi-gram, with a new super-gram based on the occurrence of the new bi-gram. Thus, common substrings are discovered by growing 2-grams, to 3-grams, to 4-grams, etc. Once characters from all index words are read by the compression engine, the compression engine has a list of symbols and decompositions for each index word.

As mention above, the compression engine may utilize the first algorithm to decompose the index words based on a cost that is defined as a function of decomposition statistics. The compression engine may identify static compression statistics and post-decomposition statistics for n-grams extracted from the index words. In turn, the cost is utilized to select n-grams that should be included in the symbol list.

Figure 4:
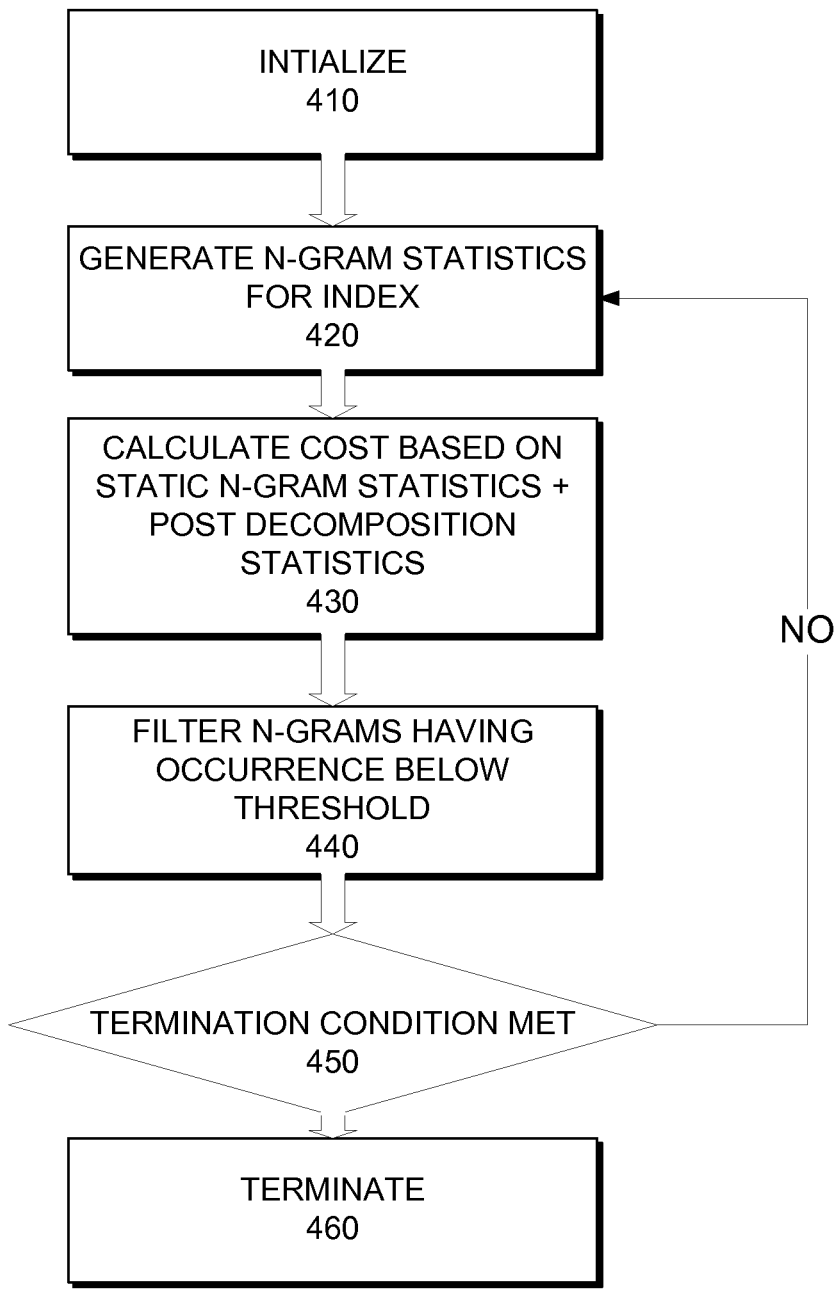
FIG. 4 is another logic diagram that illustrates a method to decompose the words stored in the indices and search results are returned in accordance with embodiments of the invention.

FIG. 4 is another logic diagram that illustrates a method to decompose the words stored in the indices in accordance with embodiments of the invention. The compression engine initializes in step 410. The compression engine generates n-grams for each word in the index. In step 420, the compression engine calculates occurrence counts of each n-gram, which are included as n-gram statistics for the index words. In turn, the compression engine defines a cost as a function of static n-gram statistics and post-decomposition statistics, in step 430. In certain embodiments, the compression engine assigns weights to the n-gram statistics as a percentage of the decompression progress. Moreover, the weight may be applied to specified windows of n-grams.

In some embodiments, the compression engine filters n-grams having occurrence below a specified occurrence threshold in step 440. In one embodiment the compression engine filters n-grams utilizing the static n-gram statistics, which provide the occurrence of the n-grams in the index words. In another embodiment the compression engine filters n-grams utilizing the post-decomposition n-gram statistics, which provide the occurrence of a selected n-gram in the index words. When the occurrence is below the occurrence threshold, the n-grams are dropped. The remaining n-grams are candidates for the symbol list.

The compression engine determines the cost of n-gram selection based on the n-gram statistics that include the occurrence count of each of the remaining n-grams. In turn, the compression engine, in step 450, determines whether a termination condition is met, e.g., the selected n-grams minimize the cost or a specified number of iterations is passed. If the cost is not minimized, the compression engine continues with another iteration. If the cost is minimized or a specified number of iterations is passed, the method terminate in step 460.

In certain embodiments, dynamic programming is utilized by the compression engine to select n-grams that minimize the cost. In turn, the selected n-grams may be stored in the symbol list. The compression engine may compress the search index using the symbol list and occurrence count. In one embodiment, the compression engine may utilize Huffman encoding on the words in the search index using the symbol list and occurrence count. In an alternate embodiment, the compression engine performs an arithmetic encoding on the words in the index using the symbol list and occurrence count.

Accordingly, the first algorithm scans all index words to collect the static n-gram statistics. The first algorithm iteratively selects n-grams as substrings based on the cost, which is defined as a function of the n-gram statistics. Thus, the compression engine generates the symbol list that is utilized to compress the index words by minimizing the cost function.

The above algorithms and compression engine are part of a computing system. The computing system may include various components. For instance, the computing system includes processors and memories that are utilized to implement the logic associated with the various algorithms executed by the compression engine. Accordingly, the logic represents computer-implemented methods.

Figure 5:
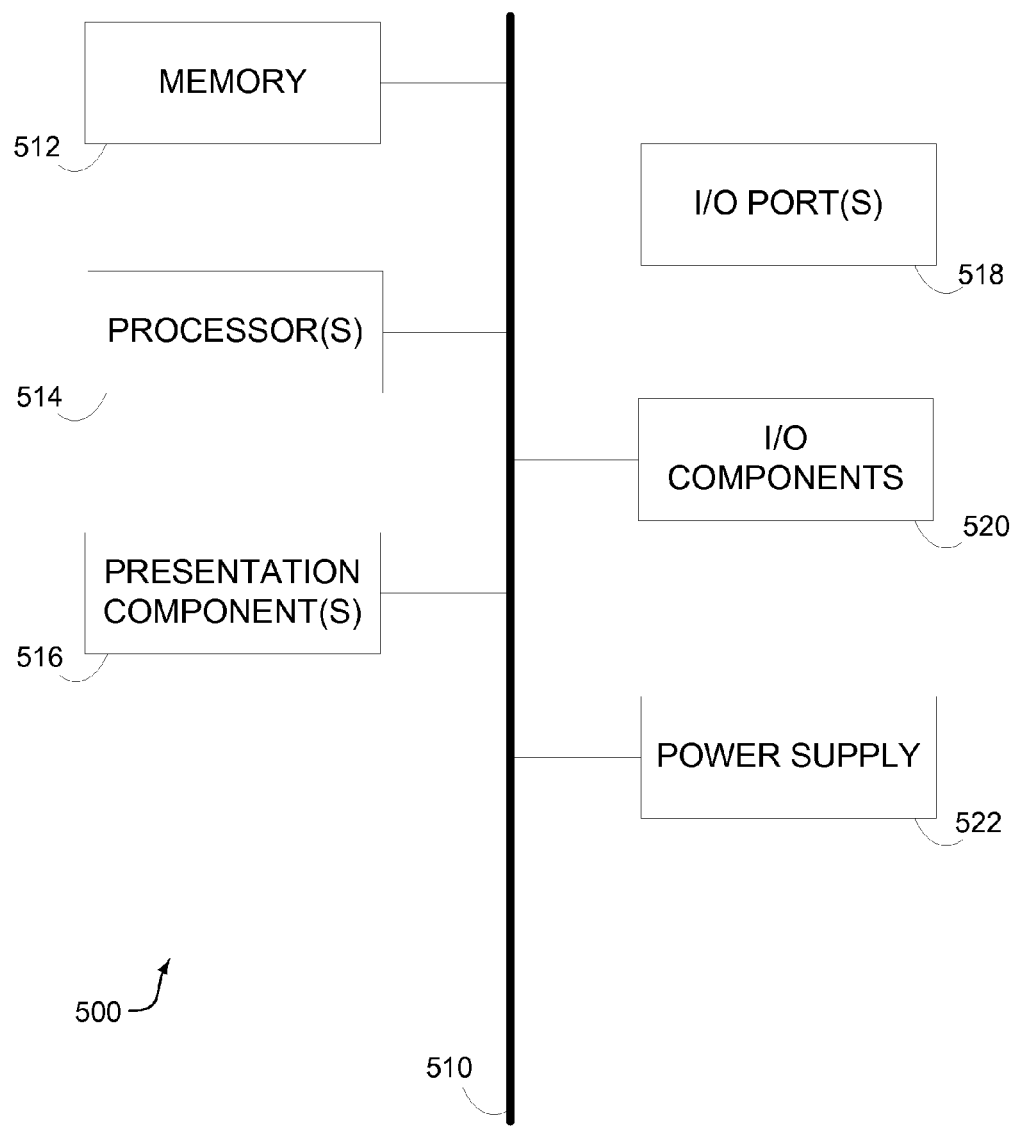
FIG. 5 is a block diagram that illustrates an exemplary computing system in accordance with embodiments of the invention.

FIG. 5 is a block diagram that illustrates an exemplary computing system m in accordance with embodiments of the invention.

Referring initially to FIG. 5 in particular, an exemplary operating environment for implementing embodiments of the present invention is shown and designated generally as computing device 500. Computing device 500 is but one example of a suitable computing environment and is not intended to suggest any limitation as to the scope of use or functionality of invention embodiments. Neither should the computing environment be interpreted as having any dependency or requirement relating to any one or combination of components illustrated.

Embodiments of the invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. Embodiments of the invention may be practiced in a variety of system configurations, including handheld devices, consumer electronics, general-purpose computers, more specialty computing devices, etc. Embodiments of the invention may also be practiced in distributed computing environments where tasks are performed by remote-processing devices that are linked through a communications network.

With reference to FIG. 5, computing device 500 includes a bus 510 that directly or indirectly couples the following devices: memory 512, one or more processors 514, one or more presentation components 516, input/output ports 518, input/output components 520, and an illustrative power supply 522. Bus 510 represents what may be one or more busses (such as an address bus, data bus, or combination thereof). Although the various blocks of FIG. 5 are shown with lines for the sake of clarity, in reality, delineating various components is not so clear, and metaphorically, the lines would be more accurately be grey and fuzzy. For example, one may consider a presentation component such as a display device to be an I/O component. Also, processors have memory. We recognize that such is the nature of the art, and reiterate that the diagram of FIG. 5 is merely illustrative of an exemplary computing device that can be used in connection with one or more embodiments of the invention. Distinction is not made between such categories as "workstation," "server," "laptop," "handheld device," etc., as all are contemplated within the scope of FIG. 5 and reference to "computing device."

Computing device 500 typically includes a variety of computer-readable media. By way of example, and not limitation, computer-readable media may comprises Random Access Memory (RAM); Read Only Memory (ROM); Electronically Erasable Programmable Read Only Memory (EEPROM); flash memory or other memory technologies; CDROM, digital versatile disks (DVD) or other optical or holographic media; magnetic cassettes, magnetic tape, magnetic disk storage or other magnetic storage devices, carrier wave or any other medium that can be used to encode desired information and be accessed by computing device 500.

Memory 512 includes computer-storage media in the form of volatile and/or nonvolatile memory. The memory may be removable, nonremovable, or a combination thereof. Exemplary hardware devices include solid-state memory, hard drives, optical-disc drives, etc. Computing device 500 includes one or more processors that read data from various entities such as memory 512 or I/O components 520. Presentation component(s) 516 present data indications to a user or other device. Exemplary presentation components include a display device, speaker, printing component, vibrating component, etc.

In some embodiments, the search engine receive a search request from a user of a computer. The search engine may request that the he compression engine encode the search request. The compression engine may receive the search request and generate an encoded search request. In turn, the search engine traverses the compressed search index with the encoded search request to locate results.

Figure 6:
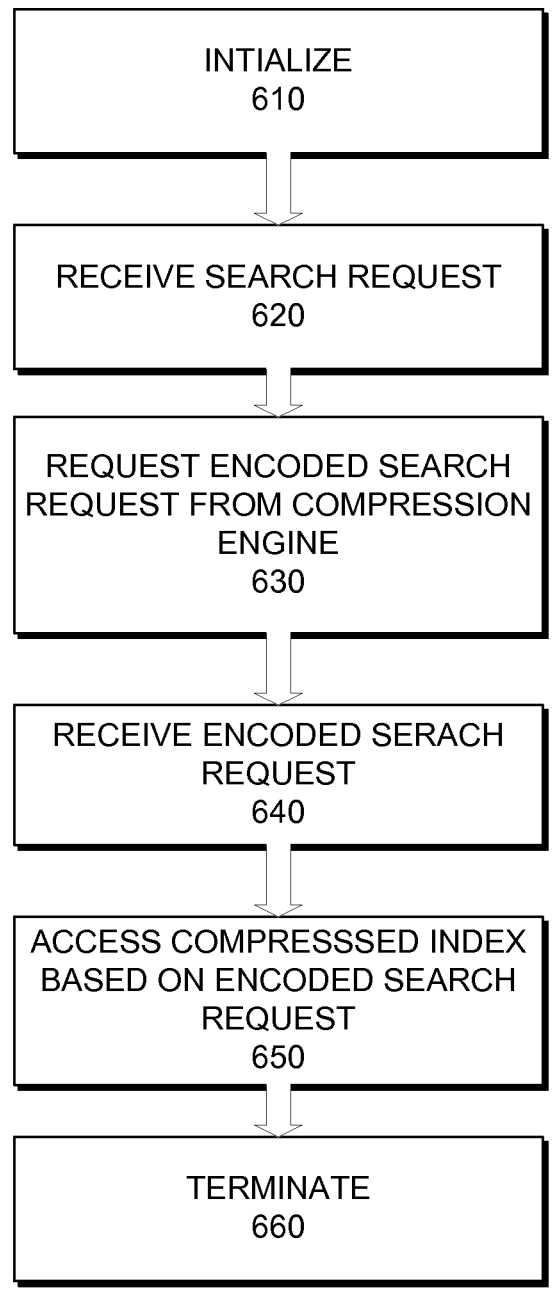
FIG. 6 is a logic diagram that illustrates a method to locate search results in accordance with embodiments of the invention.

FIG. 6 is a logic diagram that illustrates an method to locate search results in accordance with embodiments of the invention.

The method initializes in step 610. In step 620, the search engine may receive a search request from a user. In step 630, the search engine may invoke the compression engine to encode the search request. In some embodiments, the compression engine decomposes and encodes the search request using the symbol list associated with the compressed search index.

In step 640, the search engine receives the encoded search request from the compression engine. The search engine may access the compressed search index utilizing the encoded search request, in step 650. The compressed search index may include terms that match the terms in the encoded search request. The method terminates in step 660.

In summary, a compression engine decomposes and compresses words in a search index. In turn, the compressed search index remains searchable when the compressed search index is traversed with an encoded search request. The search index encoding may be a lossless compression algorithm that utilizes a symbol list and occurrence count generated by the compression engine during a decomposition phase.

The foregoing descriptions of the embodiments of the invention are illustrative, and modifications in configuration and implementation are within the scope of the current description. For instance, while the embodiments of the invention are generally described with relation to illustrated figures, those descriptions are exemplary. Although the subject matter has been described in language specific to structural features or methodological acts, it is understood that the subject matter defined in the appended claims is not necessarily limited to the specific features or acts described above. Rather, the specific features and acts described above are disclosed as example forms of implementing the claims. The scope of the embodiment of the invention is accordingly intended to be limited only by the following claims.

I claim:

1. A computer-implemented method for compressing a list of words in an index in two phases: a decomposition phase and an encoding phase, the method comprising:
    during the decomposition phase, generating static decomposition statistics and parsing all words in the list of words to create a symbol list, wherein parsing all words in the list of words to create the symbol list further comprises:
        generating a list of bi-grams from each word in the list of words, wherein each bigram contains two characters extracted from the word,
        storing the bi-grams in the symbol list,
        counting occurrence of each bi-gram,
        storing the occurrence count as a static decomposition statistic for each bigram;
        associating the occurrence count with the bi-gram,
        determining whether the occurrence count is above a specified threshold,
        filtering the bi-gram when the occurrence count is below the specified threshold by dropping the bi-gram from the symbol list,
        creating a super-gram that represents the bi-gram when the occurrence count is above the specified threshold,
        replacing the bi-gram with the super-gram in the symbol list,
        treating the super-gram as a single character,
        forming new bi-grams using the super-gram, and
        calculating an occurrence count for the new bi-grams;
    identifying substrings in each word in the list of words by decomposing the word based on the symbol list; and
    during the encoding phase, encoding the identified substrings with the symbol list, wherein the symbol list is associated with weights that vary based on decomposition progress and the weights include the static decomposition statistics and at least one post-decomposition statistic.

2. The computer-implemented method of claim 1, further comprising:
    compressing the list of words using the symbol list and occurrence count.

3. The computer-implemented method of claim 2, wherein compressing the list of words in the index comprises: performing a Huffman encoding on the words in the index using the symbol list and occurrence count.

4. The computer-implemented method of claim 2, wherein compressing the list of words in the index comprises: performing an arithmetic encoding on the words in the index using the symbol list and occurrence count.

5. One or more hardware computer-storage media storing computer usable instructions for performing a computer-implemented method for compressing a list of words in an index in two phases: a decomposition phase and an encoding phase, the method comprising:
    during the decomposition phase, generating static decomposition statistics and parsing all words in the list of words to create a symbol list, wherein parsing all words in the list of words to create the symbol list further comprises:
        generating a list of bi-grams from each word in the list of words, wherein each bigram contains two characters extracted from the word,
        storing the bi-grams in the symbol list,
        counting occurrence of each bi-gram,
        storing the occurrence count as a static decomposition statistic for each bigram;
        associating the occurrence count with the bi-gram,
        determining whether the occurrence count is above a specified threshold,
        filtering the bi-gram when the occurrence count is below the specified threshold by dropping the bi-gram from the symbol list,
        creating a super-gram that represents the bi-gram when the occurrence count is above the specified threshold,
        replacing the bi-gram with the super-gram in the symbol list,
        treating the super-gram as a single character,
        forming new bi-grams using the super-gram, and
        calculating an occurrence count for the new bi-grams;
    identifying substrings in each word in the list of words by decomposing the word based on the symbol list; and
    during the encoding phase, encoding the identified substrings with the symbol list, wherein the symbol list is associated with weights that vary based on decomposition progress and the weights include the static decomposition statistics and a post-decomposition statistic.

6. The media of claim 5, further comprising:
    compressing the list of words using the symbol list and occurrence count.

7. The media of claim 6, wherein compressing the list of words in the index comprises: performing a Huffman encoding on the words in the index using the symbol list and occurrence count.

8. The media of claim 6, wherein compressing the list of words in the index comprises: performing an arithmetic encoding on the words in the index using the symbol list and occurrence count.

9. One or more computer servers, the computer servers including processors and memories for implementing a compression engine configured to perform a computer-implemented method for compressing a list of words in an index in two phases: a decomposition phase and encoding phase,
    during the decomposition phase, the compression engine performs the following:

generates static decomposition statistics and parse all words in the list of words to create a symbol list, wherein to parse all words in the list of words to create the symbol list the compression engine:
  generates a list of bi-grams from each word in the list of words, wherein each bigram contains two characters extracted from the word,
  stores the bi-grams in the symbol list,
  counts occurrences of each bi-gram,
  stores the occurrences count as a static decomposition statistic for each bigram;
  associates the occurrence count with the bi-gram,
  determines whether the occurrence count is above a specified threshold,
  filters the bi-gram when the occurrence count is below the specified threshold by dropping the bi-gram from the symbol list,
  creates a super-gram that represents the bi-gram when the occurrence count is above the specified threshold,
  replaces the bi-gram with the super-gram in the symbol list, treats the super-gram as a single character, forms new bi-grams using the super-gram, and
  calculates an occurrence count for the new bi-grams;
  identifies substrings in each word in the list of words by decomposing the word based on the symbol list; and
  during the encoding phase, the compression engine encodes the identified substrings with the symbol list, wherein the symbol list is associated with weights that vary based on decomposition progress and the weights include the static decomposition statistics and a post-decomposition statistic.

10. The server of claim 8, further comprising:
compressing the list of words using the symbol list and occurrence count.

11. The server of claim 10, wherein compressing the list of words in the index comprises: performing a Huffman encoding on the words in the index using the symbol list and occurrence count.

12. The server of claim 10, wherein compressing the list of words in the index comprises: performing an arithmetic encoding on the words in the index using the symbol list and occurrence count.

\* \* \* \* \*